Jan. 23, 1968 R. A. BIDLACK 3,364,753

TUNING DEVICE

Filed Oct. 20, 1965 3 Sheets-Sheet 1

Inventor:
Robert A. Bidlack
By: Mueller, Aichele & Rauner
Attys.

Jan. 23, 1968 R. A. BIDLACK 3,364,753

TUNING DEVICE

Filed Oct. 20, 1965 3 Sheets-Sheet 2

Inventor
Robert A. Bidlack

By: Mueller, Aichele & Rauner
Attys.

Jan. 23, 1968 R. A. BIDLACK 3,364,753

TUNING DEVICE

Filed Oct. 20, 1965

3 Sheets-Sheet 3

Inventor:
Robert A. Bidlack
By: Mueller, Aichele & Rauner
Attys.

United States Patent Office 3,364,753
Patented Jan. 23, 1968

3,364,753
TUNING DEVICE

Robert A. Bidlack, Chicago, Ill., assignor to Motorola, Inc., Franklin Park, Ill., a corporation of Illinois Filed Oct. 20, 1965, Ser. No. 498,900
8 Claims. (Cl. 74—10.45)

ABSTRACT OF THE DISCLOSURE

This tuner for a television receiver uses a rotating member that has first and second gear segments spaced about the periphery of it. A first gear train is connected to the UHF tuner and a second gear train is connected to the VHF tuner. One of the gear segments engages the first gear train during a portion of the rotation of the member to drive the UHF tuner, and the other gear segment engages the second gear train to drive the VHF tuner during a portion of rotation of the member different from that portion of rotation driving the first gear train. A channel selector knob is connected to the rotating member and may be turned in a clockwise or counterclockwise direction through more than 360° to tune the receiver through the UHF and VHF bands. A second knob connected to a third gear train utilizing a clutch assembly provides for fine tuning of both the VHF and UHF tuners. A drive back gear train driven by the channel selector shaft positions a single dial to indicate the VHF or UHF channel to which the receiver is tuned.

This invention pertains generally to a multi-band signal tuning unit and more particularly to separate UHF and VHF tuners for a television receiver combined for adjustment of both units with one tuning knob for coarse tuning and one knob for fine tuning.

Separate VHF ad UHF tuners and associated individual tuning controls are used in the television industry at the present time, mainly because it has been found difficult to provide a single tuning unit with desirable manual controls for selection in the entire spectrum of television frequencies.

Numerous tuning arrangements for the coordination and control of the two separate tuning units have been proposed to enhance cabinet styling and decrease costs, but for the most part they have been relatively complicated and require more from the consumer than the turning of the control knob. Since simplicity is the keynote for saleability, television manufacturers have been hesitant to incorporate these complicated devices into television receivers. Devices are known that use a single knob for tuning both VHF and UHF tuners, and a single dial scale indicating the selected channel. Generally these cannot be tuned continuously in a clockwise or counterclockwise manner, but can be tuned only between stops at the lower end of the VHF band and the high end of the UHF band.

It is an object of this invention to provide an improved unit for adjusting both the VHF and UHF tuners of a television receiver with a single tuning knob for coarse adjustment and a single knob for fine tuning.

It is another object of this invention to provide a device for tuning both the VHF and UHF tuners of a television receiver with a single tuning knob that can be rotated continuously in either a clockwise or counterclockwise direction.

A further object of this invention is to provide a device for tuning both the VHF and UHF tuners of a television receiver and wherein a single dial scale indicates the tuner setting for any adjustment to appear as though the device comprises one continuous tuner.

A feature of this invention is a multi-band tuning unit including a VHF and UHF tuner means having a rotatable member continuously engaging at least one of the VHF and UHF tuner means and having a periphery providing a driving relation of the same about a portion thereof and a non-driving relation about the remainder thereof. A single channel selector shaft rotates the rotatable member to tune the unit through the VHF–UHF channels.

Another feature of this invention is a device for tuning a television receiver capable of receiving VHF and UHF channels in which there is a rotatable member which is an intermittent gear with a first gear segment about the periphery for engaging and driving the VHF tuner for a portion of the rotation of the intermittent gear and a second gear segment adjacent the first segment on the periphery and driving the UHF tuner for the remaining portion of rotation. The gear ratio between the first gear segment and the VHF tuner and the second gear segment and the UHF tuner is different to provide the necessary mechanical advantage for driving each tuner from the single channel selector shaft.

Another feature of this invention is the device for tuning a television receiver capable of receiving UHF and VHF signals having the intermittent gear engaging both the VHF tuner and the UHF tuner means during the initial and terminal portions of rotation of the intermittent gear when the same is driving the VHF tuner so that the UHF tuner can be rotated through a blank area therein.

Still another feature of this invention is a device for tuning a television receiver including a dial scale having gear means coupled between the channel selector shaft and the dial scale for responding to rotation of the channel selector shaft to position the dial scale to indicate the channel to which the receiver is tuned.

Another feature of this invention is a device for tuning a television receiver capable of receiving VHF and UHF signals and having a fine tune gear train coupled to a fine tuning shaft connected to the VHF tuner and to the shaft for rotating the UHF tuner. Rotation of a single fine tuning knob drives the gear train to rotate the fine tuning shaft and the UHF tuner shaft.

A further feature of this invention is a device for tuning a television receiver capable of receiving VHF and UHF signals having the fine tune gear train coupled to the UHF tuner shaft by a clutch so that when the channel selector tunes the receiver to a VHF channel the intermittent gear locks the UHF tuning shaft so that rotation of the fine tuning knob fine tunes the VHF tuner, but the clutch disengages the gear train from the UHF shaft so that it cannot be turned to fine tune the UHF tuner.

Yet another feature of this invention is a device for tuning a television receiver capable of receiving VHF and UHF signals having the rotation of the UHF tuner shaft during fine UHF tuning driving back to the intermittent gear and the drive back gear means coupled thereto to position the dial scale to indicate the UHF channel to which the receiver is tuned.

In practicing this invention, a channel selector shaft is coupled to an intermittent gear which is responsive to continuous rotation of the selector shaft either in a clockwise or counter clockwise direction to tune the television receiver through all of the VHF and UHF channels. The receiver has a variable stepwise VHF tuner that includes a VHF tuner shaft and a fine tuning shaft, and a continuously variable UHF tuner that has a UHF tuning shaft. The intermittent gear has a first gear segment on the periphery that engages with a drive gear on the VHF tuning shaft during a portion of rotation thereof, and a second gear segment on the periphery adjacent to the first segment that engages a drive gear on the UHF tuning shaft during the remaining portion of rotation thereof. A drive back gear train coupled between the selector shaft and the dial scale is responsive to the rotation of the selector shaft to position the dial scale to indicate the channel to which the receiver is tuned.

A fine tuning gear train is also included and is likewise driven by a single fine tuning knob. The gear train includes a gear that is connected to the VHF fine tuning shaft, and a gear that is coupled through a clutch to the UHF tuning shaft. The VHF tuner has an inoperative channel, or unused switch position, and is positioned in this channel by drive of the intermittent gear just prior to that gear engaging the UHF drive gear. Therefore, when fine tuning during the UHF channel selecting cycle, the fine tune gear train rotates the VHF fine tune shaft, but because it is an unused VHF position, it has no effect on the VHF tuner. It also drives the UHF tuning shaft through the clutch to provide UHF fine tuning. As the UHF tuner shaft rotates, it drives back to the intermittent gear and the drive back gear train to reposition the dial scale to indicate the correct UHF channel, as fine tuned. However, when the intermittent gear is engaging the VHF driving gear and the VHF tuner is in a selected channel, the rotation of the fine tuning knob is translated through the fine tune gear train to fine tune the VHF tuner. Simultaneously, the intermittent gear acts to lock the UHF tuning shaft so that the rotating gear in the fine tune train on the UHF tuning shaft is not drivingly coupled through the clutch and although it rotates, it does not fine tune the UHF tuner.

Figure 1:
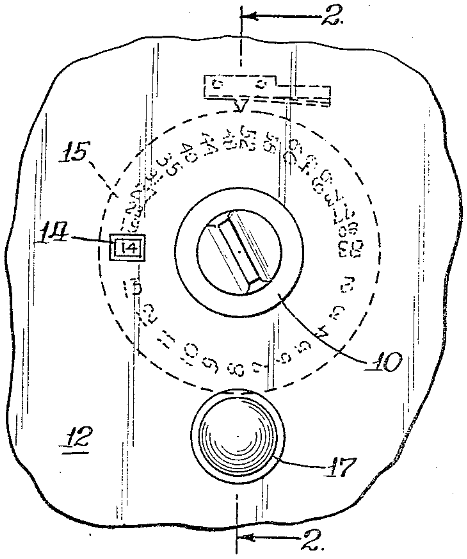
FIG. 1 is a front elevation view of the dial scale and tuner knobs of the tuning device of this invention.

FIG. 1 shows the VHF and UHF channel selector knob 10 on the front of a television receiver 12. A window 14 shows the channel number on the dial scale 15 to which the channel selector 10 is set. Directly below the channel selector 10 is a fine tuner knob 17 for fine tuning the VHF and UHF channels to which the receiver 12 is tuned.

VHF and UHF as used in this specification refer to the assigned frequency spectrum for commercial television transmitting stations. The VHF band comprises a group of 12 channels each six megacycles wide and occupying the frequency bands of 54 megacycles to 88 megacycles and 174 megacycles to 216 megacycles. The UHF frequency band includes some 70 channels each six megacycles wide and occupying the frequency band of 470 megacycles to 890 megacycles.

Figure 2:
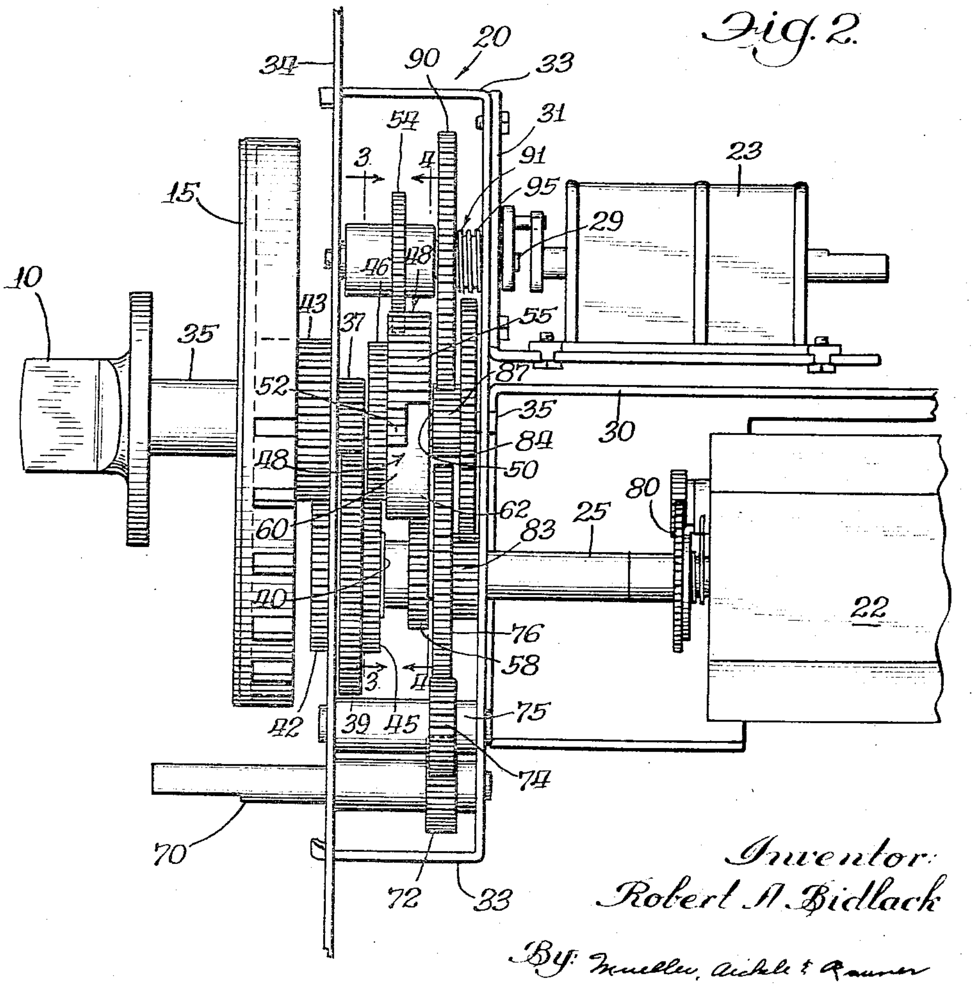
FIG. 2 is a side elevation view of the tuning device of this invention.

FIGS. 2 through 5 illustrate the construction of the device 20 for providing single knob tuning of the VHF tuner 22 and the UHF tuner 23 by rotating the channel selector knob 10. The VHF tuner 22 has a VHF tuning shaft 24 (FIG. 5) that is mounted concentrically with and journaled within the VHF fine tuning sleeve or shaft 25 (FIG. 2). The shaft 24 is connected to a multiplesection band switch 27, the construction and operation of which is well known in the art and is rotated for variable stepwise selection of the VHF television channels. The shaft 24 may be turned to any one of 13 positions, twelve of which correspond to VHF channels 2 through 13, and the 13th or channel one position which corresponds to the off or inoperative position of the VHF tuner 22. With the tuner in this inoperative channel the fine tuning slug associated with any of the VHF channels. The ingslugassociat ed with any of the VHF channels. The UHF tuner 23 is of the continuously-variable type with a blank area and includes a UHF tuner shaft 29. Brackets 30 and 31 mount the UHF tuner 23 and VHF tuner 22 respectively to a support panel 33 in the TV receiver 12. The panel 33 in turn is supported by the panel 34 of the receiver 12.

The channel selector knob 10 is connected to a selector shaft 35 which is rotatably supported by the panel 33. Connected to the shaft 35 is a channel selector drive gear 37. The gear 37 engages the gear 39 to form a drive gear train. The gear 39 is connected to a concentric shaft 40 which is supported by and free to rotate the VHF shaft 24 passing through it. Two idler gears are mounted adjacent gear 39 and the shaft 40. Idler gear 42 is outboard the front panel 34 and is engaged with gear 43 to form a drive back gear train to position the dial scale 15 which is mounted to gear 43. The second idler gear 45 engages another idler gear 46 which is integral with the intermittent gear 48. The idler gear 46 and intermittent gear 48 are connected to a sleeve 50 which is supported by and free to rotate on the selector shaft 35. The intermittent gear 48 has a first gear segment 52 on the periphery thereof that engages the UHF tuner drive gear 54, which gear 54 is connected to the UHF tuning shaft 29. A second gear segment 55 adjacent the segment 54 on the periphery of the intermittent gear 48 engages the VHF drive gear 58 which is connected to the VHF tuning shaft 24.

Figures 3, 4, 5:
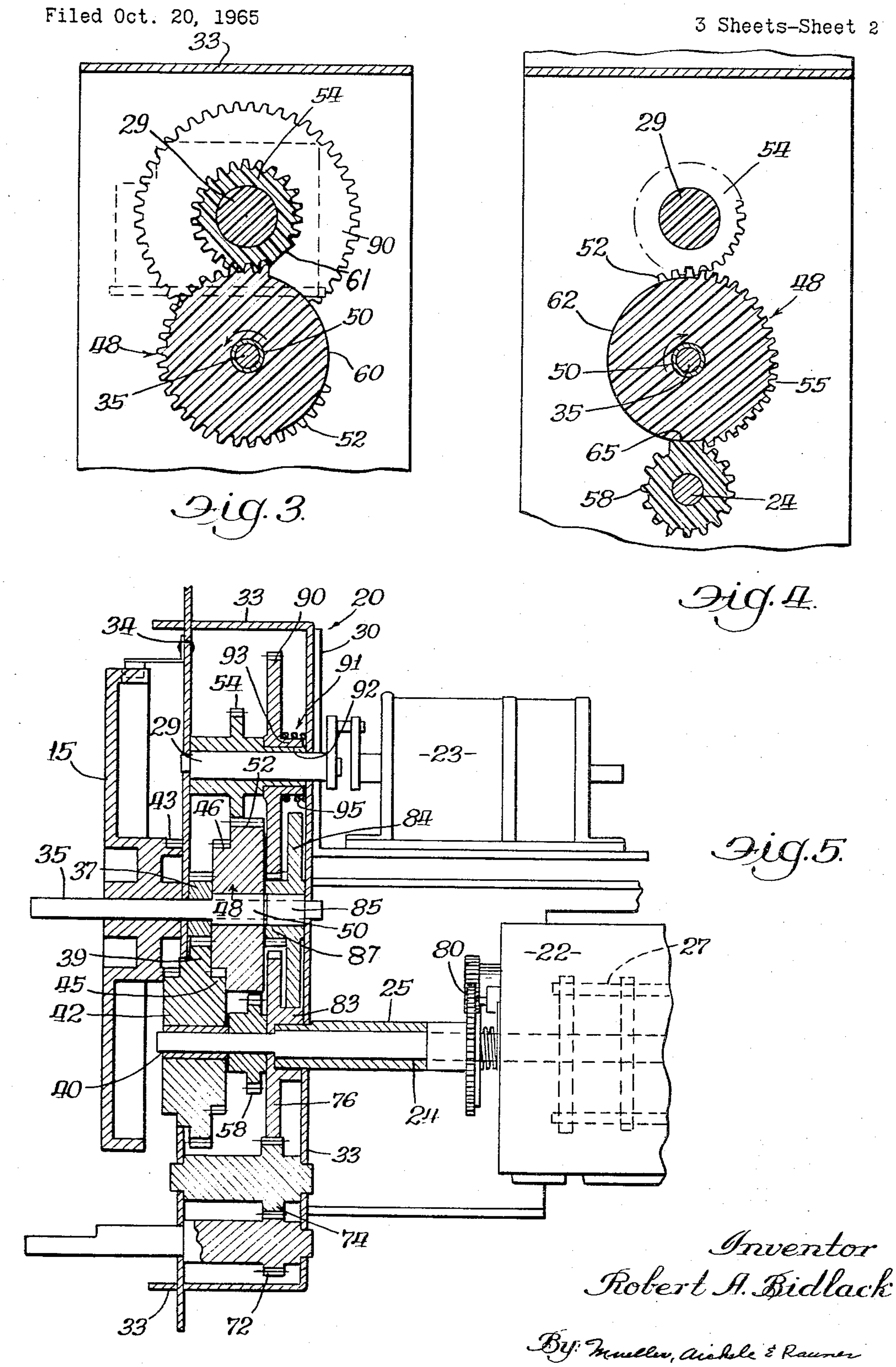
FIG. 3 is a cross-section taken along the lines 3—3 of FIG. 2.
FIG. 4 is a cross-section taken along the lines 4—4 of FIG. 2.
FIG. 5 is a side elevation cross-section of the tuning device of FIG. 2.

By referring to FIGS. 3 and 4, the interaction of the intermittent gear 48 and the drive gears 54 and 58 may be better understood. The gear segment 52 which engages the UHF drive gear 54 has a total of 28 teeth and a blank spot 60 which does not engage the drive gear 54 during a portion of the rotation of intermittent gear 48. The gear segment 55 has a total of 22 teeth which engages with the VHF drive gear 58, and a blank spot 62 which does not engage the gear 58 during that portion of rotation of the intermittent gear when the segment 52 is engaging the UHF drive gear 54. A web portion 65 blanks three teeth on the VHF drive gear 58. This web portion 65 contacts the blank 62 on the intermittent gear 48 in a friction contact, when the gear 48 is in a driving relation with UHF drive gear 54 thereby effectively locking the VHF drive gear 58. The web portion 65 also prevents interference as the teeth of gear segment 55 come into mesh with the drive gear 58. Another web portion 61 blanks three teeth on the UHF drive gear 54 (FIG. 3). This web portion 61 engages the blank spot 60 on intermittent gear 48 in a friction contact when the gear segment 55 is engaging the VHF drive gear 58, thereby effectively locking the UHF drive gear 54. The web portion 61 also prevents interference as the teeth of the gear segment 52 come into mesh with the drive gear 54.

Because the UHF tuner 23 in this particular embodiment has a blank area, it is necessary to rotate the tuner through this area during the time that VHF tuning is taking place to insure that when the UHF tuner is rotated, by the channel selector 10, it will be positioned to tune through the UHF band. To accomplish this, the gear segment 52 has three more teeth on either end thereof than does the segment 55. Therefore, when segment 55 engages the VHF drive gear 58 at the beginning of VHF tuning, the UHF drive gear 54 continues to be driven by the segment 52 for three teeth. This rotates the UHF tuner through one-half of the blank area. This is illustrated in FIG. 4 where, if the intermittent gear 48 is rotated in a clockwise direction, the three teeth of segment 52 will continue to rotate the UHF drive gear 54. At the same time, the segment 55 is commencing to engage VHF drive gear 58 to initiate VHF tuning. Continued rotation of the intermittent gear 48 in a clockwise direction through the VHF channels would cause the three additional teeth at the other of segment 52 (these teeth are hidden by the web portion 65 of gear 58 in FIG. 4) to engage the UHF drive gear 54 near the terminous of rotation of the VHF drive gear 58 by segment 55. The rotation of UHF drive gear 54 by these three teeth completes the rotation of UHF tuner 23 through the remaining one-half of the blank area. Therefore, continued rotation on the intermittent gear in the clockwise direction would drive the UHF drive gear 54 by segment 52 (FIG. 3) to rotate the UHF tuner through the UHF channels commencing from either the high end of the band or the low end of the band depending on the position of the tuner. It should be obvious in the aforedescribed example that should the person rotating the intermittent gear in a clockwise direction for VHF tuning decide to reverse direction and rotate the gear 48 in a counter clockwise direction to return to UHF tuning without going through all of the VHF channels, the three teeth would then move the UHF tuner back through the first one-half of the blank area, and the tuner would be set to rotate back through the UHF channels.

The tuning device also has provisions for fine tuning both the VHF and UHF channels with a single fine tune knob 17 connected to the fine tune drive shaft 70 which is rotatably supported by the cabinet 34 and support panel 33. The fine tune gear train includes drive gear 72 which engages with an idler gear 74. The gear 74 is mounted to a shaft 75 and is used to permit the spacing of the fine tune drive shaft 70 clear of the dial scale 15. The idler 74 engages the VHF fine tune drive gear 76 which is connected to the VHF fine tune shaft 25. The fine tune shaft 25 is connected through a gear train located generally at 80 to the fine tuning adjustment for each VHF channel. The gear ratio is such between the idler 74 and the drive gear 76 that the shaft 25 turns slowly upon operation of the fine tuning knob 17 to provide accurate fine tuning. Another gear 83 in the fine tune gear train is connected to the fine tune shaft 25 and rotates with it. This gear drives through gear 84 mounted on a hollow shaft 85 supported by drive shaft 35. Also mounted on shaft 85 is a gear 87 which engages the UHF fine tune drive gear 90. This gear 90 is mounted through a clutch assembly 91 (FIG. 5) to a portion 92 of the UHF drive gear 54 that is connected to the UHF drive shaft 29. The gear assembly 90 has a split hub 93 (FIG. 5) that is resiliently clamped by a spring 95 to the portion 92 of the UHF drive gear 54, to form the clutch 91. The gear ratio between the VHF fine tune drive gear 76, and the UHF fine tune drive gear 90 is such that rotation of the fine tune knobs 17 will cause very slow rotation of the UHF drive shaft 29 to fine tune the UHF channels.

Operation of the invention can be understood by referring to FIGS. 6 through 9 of the drawing. Those gears which take an active part in each of the tuning functions are indicated in solid while the remaining gears are shown in phantom. It should be understood that the channel selector knob 10 may be rotated in either a clockwise or counter clockwise direction while tuning the television receiver through the UHF and VHF channels.

Figures 6, 7, 8, 9:
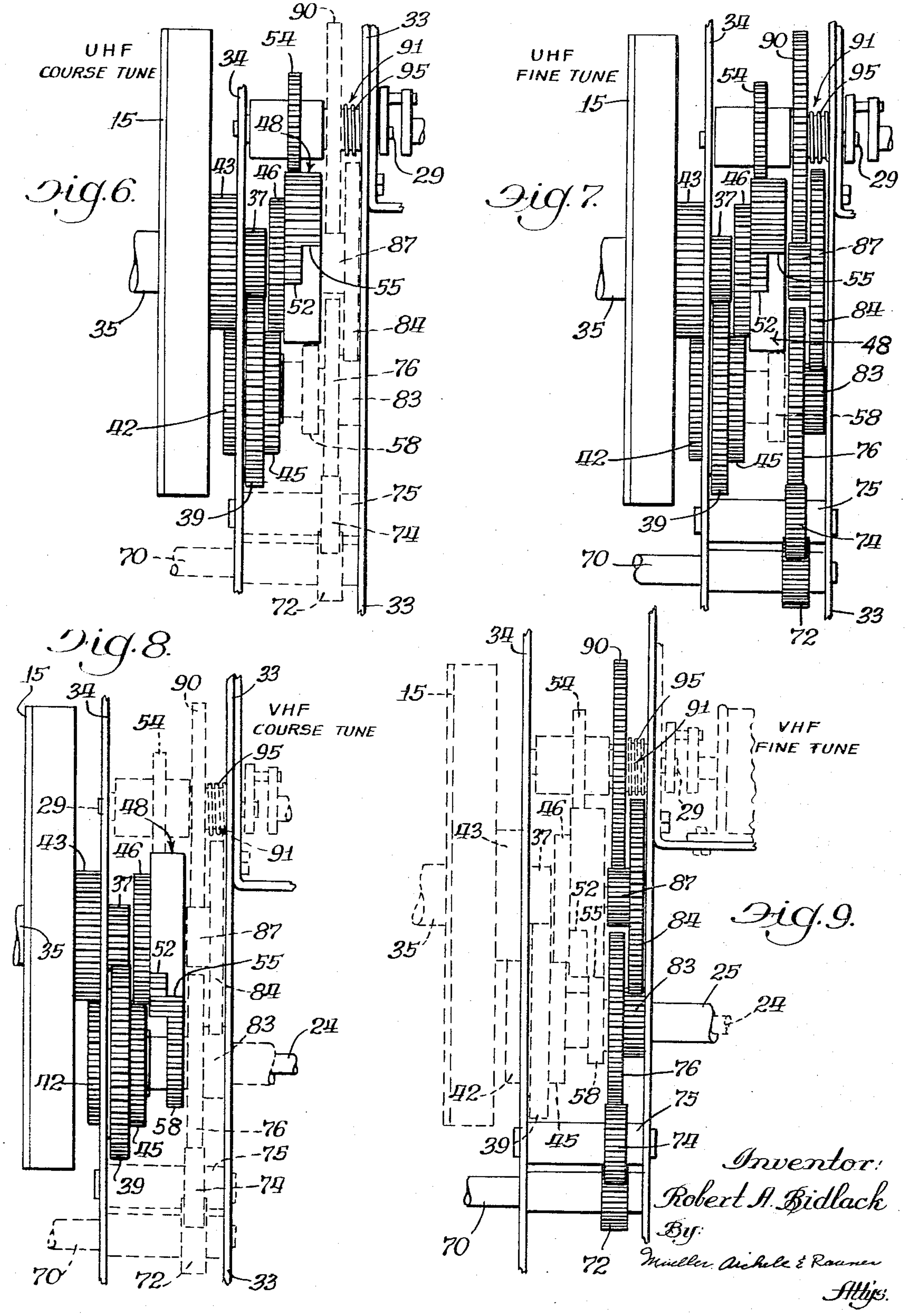
FIG. 6 is a side elevation of the tuning device of FIG. 2 partly in phantom illustrating UHF coarse tuning in accordance with this invention.
FIG. 7 is a side elevation view of the device of FIG. 2 partly in phantom illustrating UHF fine tuning.
FIG. 8 is a side elevation of the tuning device of FIG. 2 partly in phantom illustrating VHF coarse tuning.
FIG. 9 is a side elevation view of the tuning device of FIG. 2 illustrating VHF fine tuning.

FIG. 6 illustrates UHF coarse tuning. Rotating the channel selector knob 10 either clockwise or counter clockwise through the UHF channels causes the channel selector shaft 35 to rotate to drive the channel selector drive gear 37. This gear engages gear 39 which rotates and turns two idler gears 42 and 45 with it. Gear 42 and gear 43 form a drive back gear train so that as the channel selector shaft 35 is turned, the gear 42 will be rotated by gears 37 and 39 to rotate gear 43 which turns the dial scale to the correct UHF station. Idler gear 45 which also rotates with gear 39 engages an idler gear 46 connected to intermittent gear 48. Rotation of the intermittent gear 48 engages gear segment 52 with UHF drive gear 54 to rotate the UHF tuning shaft 29 to rotate the UHF tuner 23 through the UHF channels. As the segment 52 rotates to drive gear 54, the blank space on intermittent gear 48 associated with gear segment 55 rotates in a friction contact with the web portion 65 (FIG. 4) thereby effectively locking VHF drive gear 58 so that it cannot turn to rotate the VHF tune shaft.

FIG. 7 illustrates the operation of UHF fine tuning. Whenever one changes from VHF tuning to UHF tuning, the VHF tuner is positioned in the channel 1 or inoperative position. Therefore, by turning the fine tuning knob 17, the fine tune shaft 70 is rotated, rotating gear 72 to drive gear 74 which in turn drives the VHF fine tune drive 76. This gear 76 rotates to drive the VHF fine tune shaft 25 (FIG. 5), but since the VHF tuner is in the channel 1 or inoperative position, the rotation of the fine tune shaft 25 has no effect on VHF tuner. The motion of the shaft 78 is also translated through gear 83 to gear 84, gear 87 and then to the UHF fine tune gear 90. The fine tune gear 90 rotates to fine tune the UHF tuner 23. As the shaft 29 rotates, the motion is driven back through UHF drive gear 54, gear segment 52 of intermittent gear 48 and idler gears 46 and 45, to rotate gear 39 and idler gear 42 in the drive back gear train thereby moving gear 43 which repositions the dial scale to indicate the correct UHF channel.

Coarse tuning of the VHF channels is shown in FIG. 8. Rotation of the channel selector knob 10 causes the channel selector shaft 35 to rotate in a manner heretofore described which rotates selector drive gear 37 to move intermittent gear 48. For VHF tuning, as the intermittent gear 48 rotates, the gear segment 55 on the periphery thereof, engages the VHF drive gear 58 connected to the shaft 24. This rotates the shaft 24 to tune the variable stepwise tuner 22 through the VHF channels. The blank spot on intermittent gear 48 associated with gear segment 52 is in a friction contact with the web portion 61 of the UHF drive gear 54 thereby locking the drive gear and preventing the rotation of the UHF tuning shaft 29. The motion of the channel selector shaft 35 is driven back through the drive back gear train as previously described, to position the dial scale 15 to indicate the VHF stations to which the receiver is tuned.

FIG. 9 illustrates VHF fine tuning. The fine tune knob 17 is rotated to move fine tune drive shaft 70 which rotates gear 72 and 75 to rotate VHF fine tune drive gear 76. The rotation of the gear 76 causes the VHF fine tune drive shaft 25 to rotate to fine tune the VHF tuner. The rotation of knob 17 is also translated through the remainder of the fine tune drive train as described for UHF fine tune. However, because the blank portion on intermittent gear 48 is in a friction contact with the web portion 61 on the UHF drive gear 54, this gear is locked, and since gear 54 is connected to the UHF shaft 29, this shaft is also locked. Therefore, as the UHF fine tune drive gear 90 is rotated the clutch structure 91 formed by spring 95 disengages the gear 90 from the locked shaft 29, allowing the gear 90 to slip around the shaft 29 without rotating the same to effectively eliminate the UHF fine tuning feature while fine tuning VHF.

What has been described is a device for tuning both the VHF and UHF tuners of a television receiver with one knob for coarse tuning and one knob for fine tuning and wherein the knobs can be rotated either in a clockwise or counter clockwise direction. A single dial scale indicates the tuner setting for any adjustment to appear as though the device comprises one continuous tuner. The device also enhances the styling of the receiver cabinet and reduces production costs.

I claim:

1. A device for tuning a television receiver capable of receiving UHF and VHF signals, including in combination, a stepwise variable VHF tuner having a main tuning shaft and first gear means coupled to said shaft for turning the same, a continuously variable UHF tuner having a tuning shaft and including second gear means coupled to said shaft for turning the same, channel selector means, a rotatable member having a first gear segment about the periphery thereof for engaging and driving said first gear means during a portion of the rotation of said rotatable member, and a second gear segment adjacent to said first segment on said periphery for engaging and driving said second gear means during a portion of the rotation of said rotatable member different from that portion of rotation of said member driving said first gear means, and third gear means coupling said channel selector means to said rotatable member for driving the same, whereby continuous rotation of the channel selector means in a clockwise or counter clockwise direction drives said third gear means to rotate said rotatable member to alternately engage one of said first and second gear segments with one of said first and second gear means for tuning the television receiver through all of the UHF and VHF channels.

2. The combination of claim 1 with the gear ratio between said first gear means and said first gear segment on said rotatable member being different than the gear ratio between said second gear means and said second gear segment thereby providing a predetermined mechanical advantage between said channel selector means and said stepwise VHF tuner, and said channel selector means and said continuous UHF tuner.

3. A device for tuning a television receiver capable of receiving UHF and VHF signals, including in combination, a stepwise VHF tuner including first gear means for tuning the same through the VHF channels, a continuous UHF tuner having a blank area and including second gear means for tuning the same through the UHF channels, channel selector means, a rotatable member having a first gear segment about the periphery thereof for engaging and driving said first gear means during a portion of the rotation of said rotatable member, and a second gear segment adjacent to said first gear segment on said periphery for engaging and driving said second gear means during the initial and terminal portions of rotation of said rotatable member driving said first gear means and during a portion of said rotation of said member different from that portion of said rotation driving said first gear means, said second gear means being driven during the initial and terminal portions of rotation of said member to drive said UHF tuner through said blank area so that it can be continuously tuned during said portion of rotation of said member driving only said second gear means, and third gear means coupling said channel selector means to said rotatable member for driving the same, whereby continuous rotation of the channel selector means in a clockwise or counter clockwise direction drives said third gear means to rotate said rotatable member to drive said first and second gear means for tuning the television receiver through all of the UHF and VHF channels.

4. A device for tuning a television receiver capable of receiving UHF and VHF signals, including in combination, a stepwise variable VHF tuner having a first tuning shaft and a fine tuning shaft, a continuously variable UHF tuner having a second tuning shaft, first and second gear means coupled to said first and second tuning shafts respectively, said second gear means having a webbed portion thereon, an intermittent gear member having first and second gear segments which alternately engage at least one of said first and second gear means, one of said gear segments having a toothless portion thereon, channel selector means, means coupling said channel selector means to said intermittent gear member, a fine tune gear train, clutch means, said gear train including a first gear coupled to said fine tuning shaft and a second gear coupled through said clutch means to said second tuning shaft, control means for driving said gear train, said intermittent gear being responsive to movement of said channel selector means to drive said first gear means to tune said VHF tuner, and said toothless portion on said intermittent gear engaging said webbed portion on said second gear means to lock the same thereby locking said second tuning shaft, whereupon driving said fine tune gear train by said control means said first gear moves to rotate said fine tune shaft to fine tune said VHF tuner with said second gear slipping on said second shaft at said clutch to prevent fine tuning said UHF tuner.

5. A device for tuning a television receiver capable of receiving UHF and VHF transmission and having a dial providing visual means for identifying the channel to which the receiver is tuned, the device including in combination, a stepwise variable VHF tuner having a first tuning shaft and a fine tuning shaft, a continuously variable UHF tuner having a second tuning shaft, first and second gear means coupled to said first and second shafts respectively, an intermittent gear member interruptedly engaging at least one of said first and second gear means, channel selector means, means coupling said channel selector means to said intermittent gear member, third gear means coupled between said intermittent gear member and the dial, said third gear means being responsive to rotation of said channel selector means to drive back to position the dial to indicate the channel to which the receiver is tuned, a fine tune gear train including a first gear coupled to said fine tuning shaft and a second gear coupled to said second tuning shaft, control means for driving said gear train, said intermittent gear being responsive to movement of said channel selector means to drive said second gear means to tune said UHF tuner, said driving of said fine gear train by said control means rotating said second gear to rotate said second shaft to fine tune said UHF tuner, whereby said rotation of said second shaft drives back to said second gear means and said intermittent gear to rotate said third gear means to position the dial to indicate the UHF channel to which the receiver is tuned.

6. A device for tuning a television receiver, including in combination, a UHF drive shaft for a continuously variable tuner, a VHF drive shaft for a switch-type tuner, a first control shaft to be rotated for coarse adjustment of said tuners, a continuous dial to indicate the adjustment of said tuners, a first gear driven by said first control shaft, first gear means coupling said first gear to said dial for driving the same, rotatable means driven by said first gear means and having first and second gear segments for driving further gears for only a portion of the rotation of said rotatable means, a second gear on said UHF drive shaft and coupled to said first gear segment, a third gear on said VHF drive shaft and coupled to said second gear segment, the position of said first and second gear segments and said second and third gears providing alternate drive of said UHF and VHF drive shafts with continuous rotation of said first control shaft, a second control shaft to be rotated for fine adjustment of said tuners, a fine tuning shaft for said switch type tuner, second gear means drivingly connecting said second control shaft to said fine tuning shaft, third gear means and a clutch coupling said fine tuning shaft to said UHF drive shaft through said clutch for driving said UHF drive shaft from said fine tuning shaft, said UHF drive shaft operating said dial through said second gear, said rotatable means, and the driving connection of said first gear means to said rotatable means, and said clutch slipping with rotation of said fine tuning shaft and said second gear positioned adjacent a non-driving portion of said first gear segment and said first control shaft in a VHF tuning position.

7. A device for tuning a television receiver, including in combination, a UHF drive shaft for a continuously variable tuner, a VHF drive shaft for a switch-type tuner, a channel selector shaft to be rotated for coarse adjustment of said tuners, a continuous dial scale to indicate adjustment of said tuners, a channel selector drive gear driven by said channel selector shaft, drive back gear means coupling said selector drive gear to said dial scale for driving the same, an intermittent gear driven by said selector drive gear and having first and second gear segments for driving further gears for only a portion of the rotation of said intermittent gear, a UHF drive gear on said UHF drive shaft and coupled to said first gear segment, a VHF drive gear on said VHF drive shaft and coupled to said second gear segment, the position of said first and second gear segments and said UHF and VHF drive gears providing alternate drive of said UHF and VHF drive shafts with continuous rotation of said channel selector shaft, a fine tune control shaft to be rotated for fine adjustment of said tuners, a fine tuning shaft for said switch type tuner, first gear means drivingly connecting said fine tune control shaft to said fine tuning shaft, second gear means and a clutch coupling said fine tune shaft to said UHF drive shaft through said clutch for driving said UHF drive shaft from said fine tuning shaft, said UHF drive shaft operating said dial scale through said UHF drive gear, said intermittent gear, and the driving connection of said drive back gear train to said intermittent gear, and said clutch slipping with rotation of said fine tuning shaft and said UHF drive gear positioned adjacent a non-driving portion of said first gear segment and said channel selector shaft in a VHF tuning position.

8. A multi-band tuning unit capable of tuning through first and second signal bands including in combination, first tuning means for signals in the first signal band having an off position and second tuning means for signals in the second signal band, signal selector means, a rotatable member having first and second portions disposed in a spaced relationship about the periphery thereof, said portions selectively engaging said first and second tuning means respectively for driving the same, and means rotatably connecting said signal selector means to said rotatable member whereby continued rotation of said signal selector means in a clockwise or counter clockwise direction rotates said rotatable member to engage at least one said portion thereof with said respective tuning means to tune the multi-band tuning unit through the off position of said first tuning means from either direction and through the first and second signal bands.

References Cited

UNITED STATES PATENTS

| | | | |
|---|---|---|---|
| 2,873,610 | 2/1959 | Williams ---------- | 74—10.45 |
| 3,285,078 | 11/1966 | Siebold ------------ | 74—10.54 |

MILTON KAUFMAN, *Primary Examiner.*